(12) United States Patent
Murakami et al.

(10) Patent No.: US 6,377,655 B1
(45) Date of Patent: Apr. 23, 2002

(54) REFLECTIVE MIRROR FOR SOFT X-RAY EXPOSURE APPARATUS

(75) Inventors: Katsuhiko Murakami; Tokio Kato; Kuninori Shinada, all of Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/306,894

(22) Filed: May 7, 1999

(30) Foreign Application Priority Data

May 8, 1998 (JP) ............................................. 10-140404
May 8, 1998 (JP) ............................................. 10-140405

(51) Int. Cl.⁷ ................................................. G21K 1/06
(52) U.S. Cl. ............................................ 378/84; 378/43
(58) Field of Search .............................. 378/84, 34, 35, 378/43, 83, 145

(56) References Cited

U.S. PATENT DOCUMENTS

| | | | | |
|---|---|---|---|---|
| 3,944,320 A | * | 3/1976 | McLintic ........................ 350/1 |
| 4,050,931 A | * | 9/1977 | Tanner et al. ............... 75/175.5 |
| 4,389,262 A | * | 6/1983 | Tanner ........................ 148/403 |
| 4,684,565 A | * | 8/1987 | Abeles et al. ............... 428/220 |
| 5,222,112 A | * | 6/1993 | Terasawa et al. ............. 378/34 |
| 5,239,566 A | * | 8/1993 | Nakamura et al. ............ 378/43 |
| 5,265,143 A | * | 11/1993 | Early et al. ..................... 378/84 |
| 5,307,395 A | * | 4/1994 | Seely et al. ..................... 378/84 |
| 5,390,228 A | * | 2/1995 | Niibe et al. ..................... 378/34 |

FOREIGN PATENT DOCUMENTS

| JP | 08 068897 | 3/1996 |
|---|---|---|
| JP | 08 068898 | 3/1996 |

* cited by examiner

Primary Examiner—Robert H. Kim
Assistant Examiner—Irakli Kilnadze
(74) Attorney, Agent, or Firm—Morgan, Lewis & Bockius LLP

(57) ABSTRACT

A soft X-ray projection exposure apparatus has at least one metal mirror in either an illumination optical system or a projection optical system. The mirror includes a metal substrate and a thin film of an amorphous substance formed thereon. The surface of the amorphous substance is polished to optical smoothness. On the surface of the thin film is a multi-layer film that reflects X-rays of a specified wavelength. The metal substrate efficiently dissipates heat to the back surface of the mirror where it can be easily cooled. The mirror has a small shape error and surface roughness, and sufficiently suppresses thermal deformation caused by irradiating electromagnetic radiation such as X-rays or light. In this manner, the soft X-ray projection exposure apparatus achieves a higher through-put of wafers.

17 Claims, 4 Drawing Sheets

REFLECTIVE MIRROR FOR SOFT X-RAY EXPOSURE APPARATUS

This application claims the benefit of Japanese Patent Application Nos. 10-140404 and 10-140405, both filed on May 8, 1998, which are hereby incorporated by reference.

BACKGROUND OF THE INVENTION

1. Field of the Invention

The present invention relates to a reflective mirror that is used where large quantities of heat are absorbed from incident light rays or X-rays and more particularly to an optical system of a projection exposure apparatus using light or soft X-rays such as a soft X-ray projection exposure apparatus used in the manufacture of semiconductor devices, etc.

2. Description of the Related Art

In recent years, as semiconductor integrated circuit elements have become smaller in size, projection-lithographic techniques using X-rays with shorter wavelengths instead of conventional ultraviolet light have been developed in order to improve the resolution of optical systems limited by the boundaries of light diffraction. X-ray projection exposure apparatuses used in such techniques are constructed mainly from an X-ray source, an illumination optical system, a mask, a focusing optical system and a wafer stage, etc.

Syncrotron-radiation (SR) light sources or laser plasma X-ray sources are used as X-ray sources. Illumination optical systems are constructed from grazing-incidence mirrors, multi-layer film mirrors and filters that reflect or transmit only X-rays of a specified wavelength, etc., and are used to illuminate the mask with X-rays of a specified wavelength.

Masks include transmission type masks and reflection type masks. Transmission type masks are masks in which a pattern is formed by disposing a substance that absorbs X-rays in a specified shape on the surface of a thin membrane consisting of a substance that shows good transmission of X-rays.

Reflection type masks are masks in which a pattern is formed (for example) by disposing parts that have a low reflectivity in a prescribed shape on the surface of a multi-layer film that reflects X-rays. The patterns formed on such masks are focused on the surface of a wafer coated with a photo-resist by means of a projection and focusing optical system constructed from a plurality of multi-layer film mirrors, so that these patterns are transferred to the above-mentioned photo-resist. Furthermore, since X-rays are absorbed by the atmosphere and thus attenuated, the entire light path is maintained at a specified degree of vacuum.

In the X-ray wavelength region, transparent substances do not exist. Furthermore, the reflectivity at the surfaces of substances also is extremely low. Accordingly, ordinary optical elements such as lenses and mirrors, etc., cannot be used. Optical systems used for X-rays are constructed by means of grazing-incidence mirrors which reflect X-rays by utilizing the total reflection of X-rays incident on the reflective surface from an oblique direction, and multi-layer film mirrors in which the phases of the reflected X-rays coincide at the respective interfaces of a multi-layer film. Thus, a high reflectivity is obtained by means of an interference effect, etc.

Since grazing-incidence optical systems have a large aberration, a resolution at the diffraction limit cannot be obtained. On the other hand, multi-layer film mirrors are capable of reflecting X-rays perpendicularly, so that an X-ray optical system at the diffraction limit can be constructed. Accordingly, the focusing optical systems of soft X-ray projection exposure apparatuses are all constructed from multi-layer film mirrors.

In such X-ray multi-layer film mirrors where a multi-layer film consisting of molybdenum and silicon is used on the long-wavelength side at the L absorption end of silicon (12.3 nm), absorption by silicon is decreased so that the maximum reflectivity can be obtained. Nevertheless, the reflectivity at wavelengths of 13 to 15 nm is about 70% regardless of the angle of incidence. Recently developed multilayer film consisting of molybdenum and beryllium exhibits the maximum reflectivity on the long-wavelength side at the K absorption end of beryllium (11.0 nm). The reflectivity at wavelengths of 11 to 12 nm is about 70% regardless of the angle of incidence. At wavelengths shorter than the K absorption end of beryllium, hardly any multi-layer films that allow a reflectivity exceeding 30% to be obtained at perpendicular incidence have been developed.

Glass materials such as quartz, etc., which have a high shape precision, a small surface roughness, and can be worked, are used as substrate materials in multi-layer film mirrors.

In order to obtain a practical through-put (e. g., about 30 wafers per hour in the case of 8-inch wafers) in X-ray projection exposure apparatuses of the type described above, it is necessary to irradiate the surfaces of the multi-layer film mirrors making up the focusing optical system with X-rays of a certain intensity (e. g., about 10 [mW/cm$^2$]). On the other hand, as was mentioned above, the reflectivity of such multi-layer film mirrors is about 70% at the most. The remaining X-rays are absorbed, transmitted or scattered without being reflected by the multi-layer film. The loss due to scattering is slight, and the X-rays passing through the multi-layer film are more or less completely absorbed by the substrate.

Specifically, most of the X-rays that are not reflected by a multi-layer film mirror are absorbed by the multi-layer film mirror, so that the energy of these X-rays is converted into heat. The temperature of the multi-layer film mirror is elevated by this heat, so that thermal deformation occurs.

Generally, in order to obtain a resolution at the diffraction limit in an optical system, the shape error of the mirrors and lenses making up the optical system must be sufficiently small compared to the wavelength of the light used. Furthermore, in an optical system using X-rays, the permissible range of shape error is narrower than that in optical systems using visible light or ultraviolet light by an amount corresponding to the shortening of the wavelength. Viewed in this way, the thermal deformation of the multi-layer film mirrors caused by the above-mentioned X-ray irradiation has a major effect on the focusing characteristics of the multi-layer film mirrors. Accordingly, there is a danger that the designed resolution cannot be obtained.

Consequently, the cooling of such mirrors from the underside of the substrate of each mirror is performed in order to prevent any thermal deformation effect on the focusing characteristics. However, a sufficient effect cannot be obtained in such methods. Furthermore, since X-ray optical systems are used in a vacuum, there is almost no heat conduction to environment from the surfaces of the mirrors.

Accordingly, in order to prevent the effects of thermal deformation on the focusing characteristics, it is necessary to limit the intensity of the X-rays incident on the mirrors. If this is done, however, the through-put of the soft X-ray projection exposure apparatus using these mirrors drops. In other words, a problem of conventional mirrors is that high resolution and high through-put of the soft X-ray projection exposure apparatus could not be simultaneously achieved.

Problems encountered in the X-ray optical system of a soft X-ray exposure apparatus have been described above. However, problems caused by thermal deformation of reflective mirrors are also encountered to a varying degree in other X-ray optical systems and in optical systems using light rays in wavelength regions other than the X-ray wavelength region.

SUMMARY OF THE INVENTION

The present invention is directed to a reflective mirror that has a small shape error and surface roughness, and can sufficiently suppress thermal deformation caused by irradiating electromagnetic radiation such as X-rays, light, etc.

An object of the present invention is to provide a method for manufacturing a reflective mirror with reduced thermal deformation.

Still a further object of the present invention is to provide a soft X-ray projection exposure apparatus that makes it possible to achieve both a high resolution and a high through-put.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve these and other advantages and in accordance with the purpose of the invention, as embodied and broadly described herein, the invention include a soft X-ray projection exposure apparatus having at least one metal mirror. The mirror constitutes at least one of an illumination optical system and a projection optical system. The mirror includes a metal substrate having a front surface and a rear surface. A thin film of an amorphous substance is formed on the front surface of the metal substrate. A front surface of the amorphous substance is polished to optical smoothness. A multi-layer film is formed on the front surface of the thin film. The multi-layer film reflects X-rays of a specified wavelength.

In another aspect of the invention, a method for manufacturing a mirror is provided. A metal substrate is prepared. An amorphous thin film containing a nickel alloy as a chief ingredient is formed on a surface of the metal substrate. A surface of the amorphous thin film is worked into an optically smooth surface.

In another aspect, the invention includes a mirror for use when large amounts of heat from incident electromagnetic radiation is absorbed. The mirror includes a metal substrate having a front surface and a back surface. A thin film of an amorphous substance is formed on the front surface of the substrate. The thin film has a surface polished to optical smoothness.

It is to be understood that both the foregoing general description and the following detailed description are exemplary and explanatory only are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles on of the invention.

FIG. 3($b$) is a graph that illustrates a uniform temperature gradient in the x direction inside the substrate that constitutes the reflective mirror.

DESCRIPTION OF THE PREFERRED EMBODIMENTS

Figure 1:
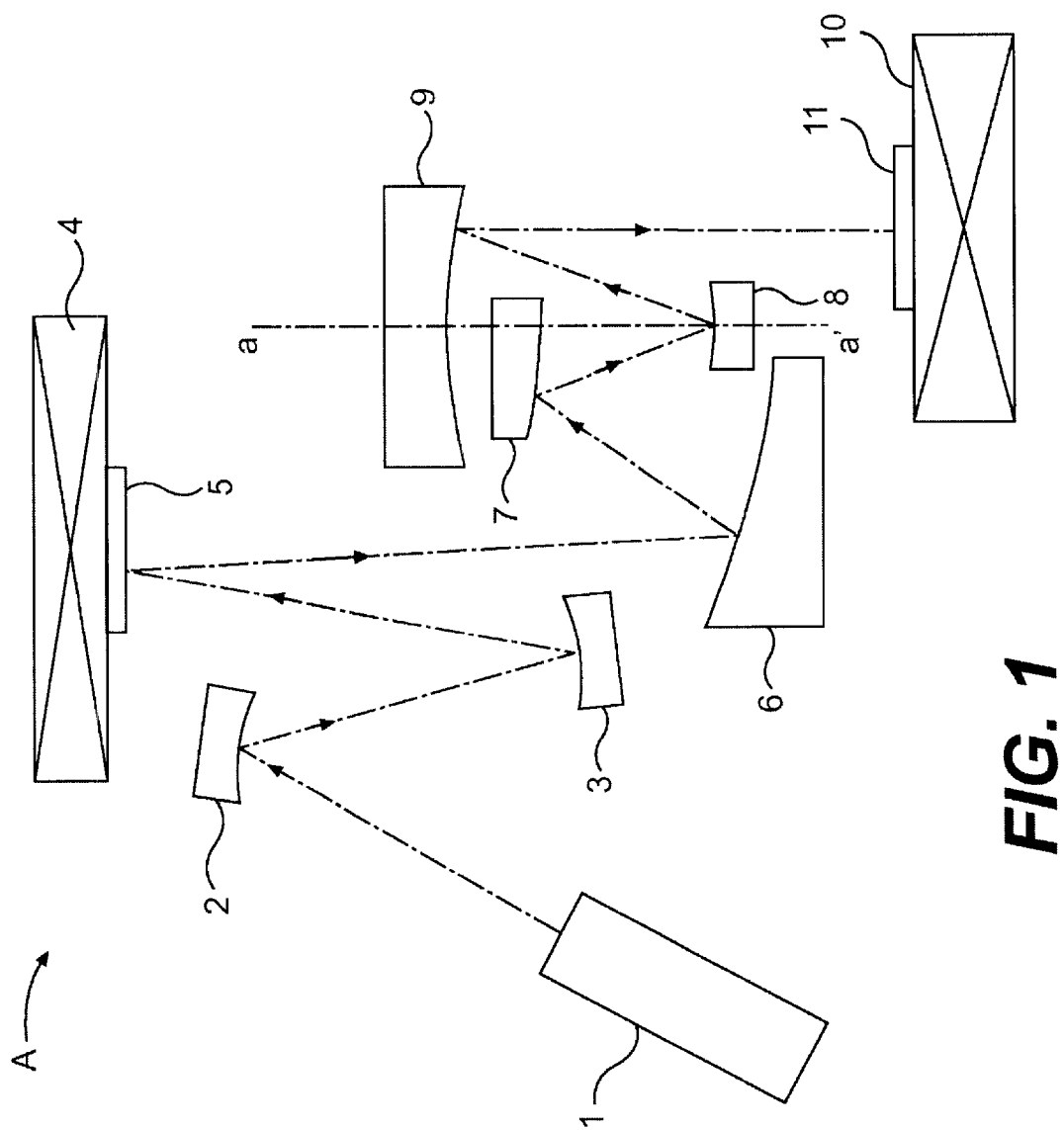
FIG. 1 is a schematic diagram that illustrates one example of a soft X-ray projection exposure apparatus using the reflective mirror of the present invention.

Reference will now be made in detail to the present preferred embodiments of the invention, examples of which are illustrated in the accompanying drawings. Wherever possible, the same reference numbers will be used throughout the drawings to refer to the same or like parts.

In a first embodiment of the present invention, a soft X-ray projection exposure apparatus uses metal mirrors as some or all of the mirrors constituting the illumination optical system and projection optical system. The above-mentioned metal mirrors have a metal substrate, a thin film of an amorphous substance that is formed on the surface of the above-mentioned metal substrate and whose surface is polished to optical smoothness, and a multi-layer film that is formed on the surface of the above-mentioned thin film and that reflects X-rays of a specified wavelength.

Here, the term "surface polished to optical smoothness" refers to polishing to a smoothness such that the surface has a reflectivity of 80% or more of the reflectivity of a perfectly flat or reflective surface.

In the present embodiment, some or all of the mirrors constituting the illumination optical system or projection optical system use metal substrates (including alloy substrates) as substrates. Thus, the heat generated by the X-rays incident on the mirrors can be efficiently dissipated to the side of the cooling device installed on the back surface of each mirror. Accordingly, shape error caused by thermal deformation is reduced. Furthermore, the metal substrates are easily worked, so that shape error during manufacture can be reduced.

It is, however, difficult to reduce the surface roughness of a metal or alloy substrate. As a result, when a multi-layer film that reflects X-rays of a specified wavelength is formed directly on top of such a metal substrate, the reflectivity drops so that the resulting mirror cannot be used as a mirror in the soft X-ray projection exposure apparatuses of the present invention. Accordingly, in the mirror of the present embodiment, an amorphous substance whose surface is polished to an optical smoothness is formed on top of such a substrate. Since the surface of such an amorphous substance can be polished to an optical smoothness, a mirror with a high reflectivity can be obtained by forming a multi-layer film that reflects X-rays of a specified wavelength on the smoothly polished surface. This film is used as a reflective surface.

Specifically, in such a mirror, shape error and surface roughness are reduced, and thermal deformation caused by irradiating light can be suppressed to a sufficiently small value. In the present means, such mirrors are used as some or all of the mirrors constituting the projection optical system. Accordingly, X-rays with a strong intensity can be used, and both a high resolution and a high through-put can be achieved.

A second embodiment consists of the above-mentioned first embodiment, and is characterized by the fact that the following condition is satisfied where η[W/m·K] is the thermal conductivity of the metal substrates making up the above-mentioned metal mirrors, α[1/K] is the coefficient of linear expansion, Q [W/m²] is the thermal flux applied to the mirrors by light rays or X-rays, and d [m] is the mean thickness of the mirrors:

$$\alpha \cdot Q \cdot d^2/(2\eta) \leq 10^{-9} [m] \qquad (1)$$

Equation (1) is an expression that means that the deformation of the reflective mirror caused by thermal deformation is kept to 1 nm or less. Equation (1) will be described with reference to FIG. 3. The actual deformation of a mirror varies greatly depending on the shape and dimensions of the mirror. Accordingly, calculations based on the finite element method, etc., are necessary in order to calculate the mirror deformation accurately. Here, the approximate value of such deformation will be calculated using the simplification shown below.

Figure 3A:
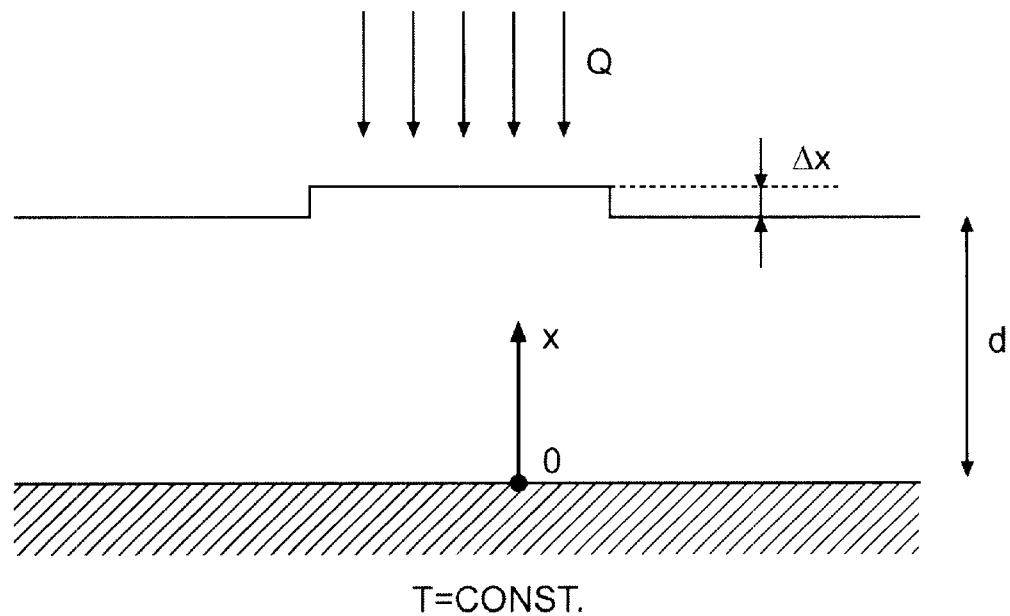
FIG. 3($a$) is a diagram that illustrates thermal deformation of the substrate that constitutes the reflective mirror.

FIG. 3 shows the thermal deformation Δx [m] that occurs where the back surface of a mirror of thickness d [m] (assumed to have a flat surface for the sake of simplicity) is maintained at a constant temperature T [K], while the front surface is irradiated with X-rays. In this expression, the expansion (or contraction) Δx in a direction perpendicular to the substrate (i.e., the x direction) in the area of injection (or area of irradiation) where a steady thermal flux Q [W/m²] (i.e., the energy of those X-rays among the irradiating X-rays that are absorbed by the substrate rather than being reflected) is injected into a portion of the front surface of the substrate is considered.

Figure 3B:
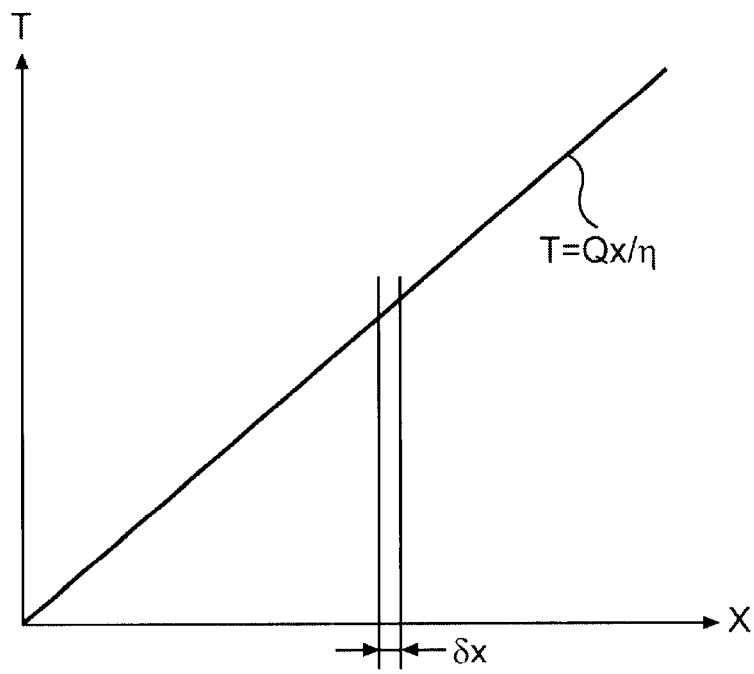

The discussion will be simplified by ignoring thermal conduction in the lateral direction. In this case, a uniform temperature gradient is created in the x direction inside the substrate as shown in FIG. 3(b). Accordingly, the temperature (temperature difference from the heat sink at x=0) T(x) at position x is given as follows where η[W/m·k] is the thermal conductivity:

$$T(x) = Qx/\eta \qquad (2)$$

Furthermore, the expansion Δ(δx) of a thin layer (thickness δx) within the substrate is given by the following equation:

$$\Delta(\delta x) = \alpha \cdot T(x) \cdot \delta x \qquad (3)$$

Here, α is the coefficient of thermal expansion (coefficient of linear expansion [1/K]) of the substrate material.

Accordingly, the expansion Δx of the substrate overall is as follows:

$$\Delta x = \int \Delta(\delta x) = \alpha \int_0^d T(x) dx = \frac{\alpha Q}{\eta} \int_0^d x dx = \frac{\alpha Q d^2}{2\eta} \qquad (4)$$

Accordingly, if Equation (1) is satisfied, then the deformation (amount of expansion) of the reflective mirror caused by thermal deformation can be kept 1 nm or less. As a result, a mirror with sufficient precision for use as a mirror in projection exposure apparatus using X-rays can be obtained.

A third embodiment consists of the above-mentioned first embodiment, and is characterized by the fact that the metal substrates making up the above-mentioned metal mirrors consist of an Invar alloy.

Invar alloys are metals that have a low coefficient of linear expansion. Accordingly, by using such alloys as metal substrates in mirrors, it is possible to obtain mirrors that show little thermal deformation.

A fourth embodiment consists of the above-mentioned first embodiment, and is characterized by the fact that the metal substrates making up the above-mentioned metal mirrors consist of aluminum, copper, beryllium, silver, gold or an alloy containing at least one of these materials.

The above-mentioned metals have a thermal conductivity of 200 [W/m·K] or greater, and are desirable from the standpoint of heat dissipation.

A fifth embodiment consists of one of the above-mentioned first through fourth embodiments which is characterized by the fact that the surface roughness of the amorphous substance making up the above-mentioned metal mirrors is 0.5 nm (rms) or less.

As will be described below, setting the surface roughness of the above-mentioned amorphous substance at 0.5 nm (rms) or less makes it possible to obtain a reflectivity that is equal to 80% or more of the reflectivity of a perfectly flat surface with respect to practical X-rays. Furthermore, since the surface roughness of the amorphous substance is 0.5 nm (rms) or less, the irregularity of the multi-layer film formed on top of the amorphous substance has a similar value, so that an optically flat reflective body can be obtained.

A sixth embodiment consists of any one of the above-mentioned first through fifth embodiments and is characterized by the fact that the above-mentioned amorphous substance making up the above-mentioned metal mirrors, or the principal component of this amorphous substance, is nickel or a nickel alloy.

In the case of nickel alloys, a film can easily be formed on a metal substrate or alloy substrate by plating. Furthermore, the surface roughness of this film can be reduced to approximately 0.4 nm (rms). Accordingly, it is desirable to use such alloys as the above-mentioned amorphous substance.

A seventh embodiment consists of any one of the above-mentioned first through fifth embodiments, and is characterized by the fact that the amorphous substance making up the above-mentioned metal mirrors is one substance selected from a set consisting of silicon oxide, silicon carbide, PSG (phospho-silicate glass), silicon nitride, silicon, carbon and substances containing the above-mentioned substances as principal components.

With the above-listed substances, the surface roughness can be reduced to approximately 0.4 nm (rms). Accordingly, it is desirable to use these substances as the above-mentioned amorphous substance. These substances can be formed using ordinary thin-film formation techniques, such as vacuum evaporation, sputtering, ion plating or CVD (chemical vapor deposition), etc.

Below, a preferred embodiment of the present invention will be described with reference to the attached figures. With reference to FIG. 1, a soft X-ray projection exposure apparatus A includes an X-ray source 1, X-ray multi-layer film mirrors 2 and 3 (making up an illumination optical system), a mask stage 4, a reflective mask 5, X-ray multi-layer film mirrors 6, 7, 8, and 9 (making up a projection optical system), a wafer stage 10, and a wafer 11.

A laser plasma light source is used as the X-ray source 1. The beam radiated from the X-ray source 1 is focused by an illumination optical system consisting of two X-ray multi-layer film mirrors 2 and 3, so that the reflective mask 5 carried on the mask stage 4 is illuminated. The beam reflected by the reflective mask 5 passes through a projection optical system constructed from four X-ray multi-layer film mirrors 6, 7, 8, and 9, and reaches the wafer 11 held on the wafer stage 10. An image of the circuit pattern formed on the reflective mask 5 is transferred onto the wafer 11 after being reduced to ¼ the original size.

A molybdenum (Mo)/silicon (Si) multi-layer film, which reflects soft X-rays with a wavelength in the vicinity of 13 nm, is used for the X-ray multi-layer film mirrors 2, 3, 6, 7, 8, and 9 making up the illumination system and projection system, and for the reflective mask 5.

The reflectivity of the X-ray multi-layer film mirrors is approximately 70%, with the remaining 30% of the X-rays being absorbed by the mirrors and converted into heat. In this case, the intensity of the X-rays drops by an amount corresponding to the loss caused by absorption each time the X-rays are reflected from an X-ray multi-layer film mirror. Accordingly, the intensity of the X-rays incident on the respective X-ray multi-layer film mirrors is larger as the mirror in question is located upstream closer to the X-ray source 1. Preferably, the respective mirrors are cooled by means of water cooling in order to dissipate the absorbed heat. However, it is to be appreciated that other cooling means may be used.

The reflective surfaces of the four mirrors 6, 7, 8, and 9 making up the projection optical system all have a shape that is rotationally symmetrical about the optical axis a—a. The mirror 8 is disposed on the optical axis a—a, and the effective diameter of the mirror 8 is the diaphragm of the projection optical system. Here, since the mirror 8 is located on the downstream side in the projection system (i.e., the third of four mirrors), the intensity of the X-rays incident on this mirror is not very strong. However, since the area irradiated by the X-rays is small, the irradiating X-ray intensity per unit area is the largest among the four mirrors making up the projection system.

Accordingly, a mirror that has a metal substrate, a thin film of an amorphous substance that is formed on the surface of the above-mentioned substrate and whose surface is polished to an optical smoothness, and a multi-layer film that is formed on the surface of the above-mentioned thin film and reflects X-rays of a specified wavelength, is used as the mirror 8. Mirror 8 has the largest thermal load in the projection system.

Furthermore, the intensity of the X-rays incident on the X-ray multi-layer film mirrors 2 and 3 of the illumination system located immediately after the X-ray source 1 is especially large. This intensity creates a thermal load that causes deformation of the mirrors and deterioration of the multi-layer films. Accordingly, it is preferable to use mirrors of the type characterizing the present invention as these mirrors as well. It is to be appreciated by those skilled in the art that the question of which mirrors should consist of mirrors of the type characterizing the present invention may be determined by an appropriate selection of mirrors. Further, it is to be appreciated that mirrors of the type characterizing the present invention are placed in alternative embodiments at points where thermal load per unit area of mirror might deform conventional mirrors at the same points when seeking to achieve higher through-put.

Figure 2:
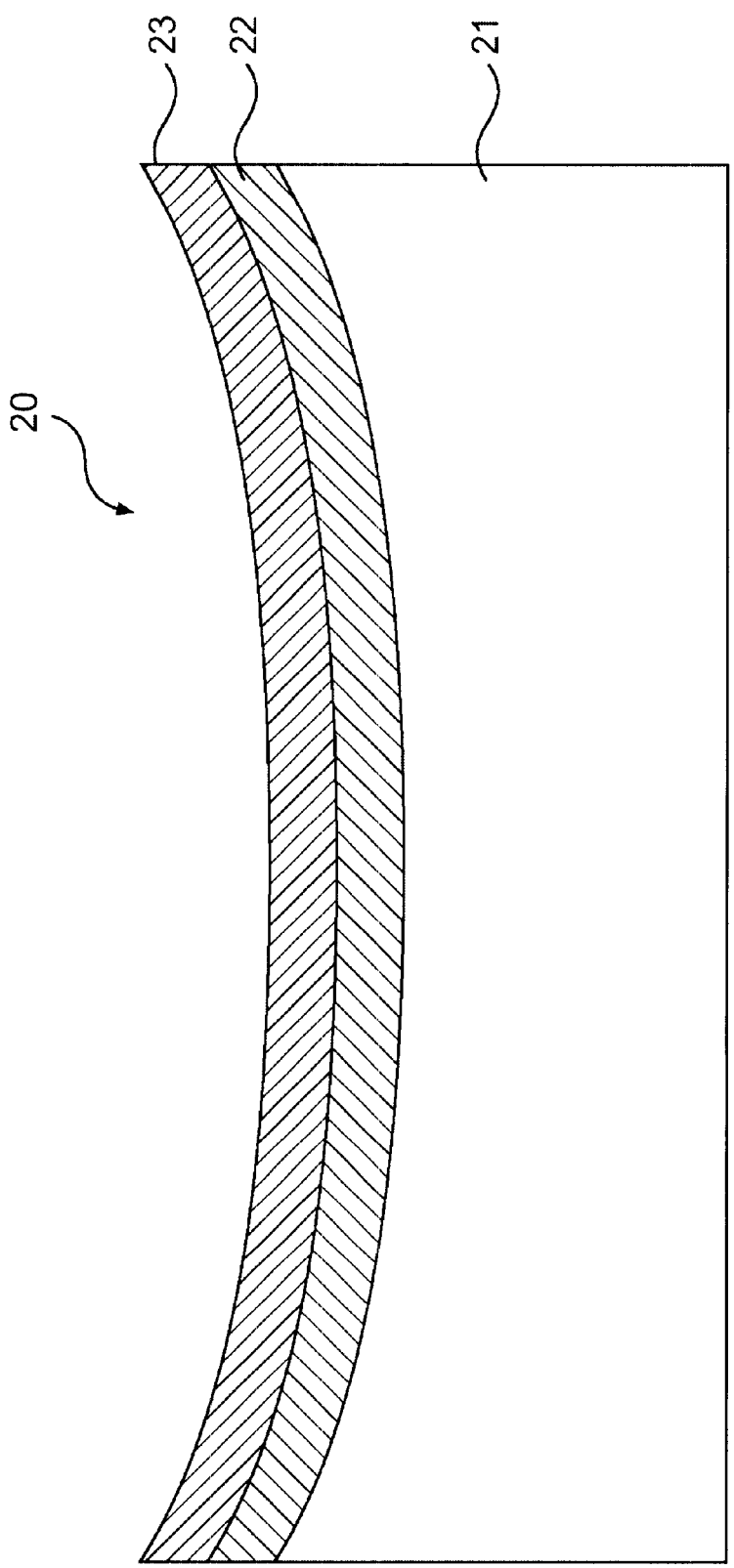
FIG. 2 shows one example of a working configuration of the mirror of the present invention.

With reference to FIG. 2, a preferred embodiment of a mirror 20 of the present invention includes a metal substrate 21, an amorphous thin film 22, and a multi-layer film 23. The amorphous thin film 22 is formed on the surface of the metal substrate 21, and the multi-layer film 23, which reflects X-rays of a specified wavelength, is formed on the surface of the amorphous thin film 22. In cases where electromagnetic or light rays other than X-rays are used, there is no need to form the multi-layer film 23.

The metal substrate 21 may also consist of an alloy. A material that has a high thermal conductivity and a low coefficient of thermal expansion is desirable; generally, however, since metals and alloys have a large coefficient of thermal expansion, it is desirable that the thermal conductivity be 200 [W/m·K] or greater. In a substrate used in an ordinary soft X-ray projection exposure apparatus, the thermal conductivity of 200 [W/m·K] or greater serves to suppress the amount of thermal deformation to 1 nm or less. Substrate materials that have a thermal conductivity of 200 [W/m·K] or greater include aluminum, copper, beryllium, silver and gold (which have extremely high thermal conductivity values), as well as alloys containing at least one of these metals.

If Rayleigh's condition, which holds that the wave front aberration of an optical system must be ¼ of the wavelength or less, is used, then the shape precision for each individual mirror making up the optical system must be kept to a value within:

$$(\lambda/4 \times \frac{1}{2}) \times 1/n^{1/2} \tag{5}$$

Here, n is the number of mirrors making up the optical system, and the reason for multiplying by ½ is that the system is a reflective system.

According to Equation (5), when an optical system constructed from four mirrors for example is used at a wavelength of 13 nm, the shape error permitted for each individual mirror (permissible shape error) is 0.81 nm.

The thermal conductivity of fused quartz ($SiO_2$), which is widely used in the refractive optical systems of projection exposure apparatuses using ultraviolet light, is 1.38 [W/m·K] and the coefficient of thermal expansion is $0.5 \times 10^{-6}$[1/K]. Here, it is assumed that the thermal flux Q that is injected into the substrate is 10 [mW/cm$^2$]. In order to insure practical exposure region dimensions in an X-ray projection exposure apparatus, the diameter of the mirrors must be approximately 50 mm. Furthermore, in order to maintain the shape of the mirrors with precision, it is generally necessary that the thickness of the mirrors be approximately ¼ of the diameter. Accordingly, the thickness d of the substrate is set at 12.5 mm.

When the amount of thermal deformation of fused quartz is calculated by substituting these numerical values into Equation (1), a value of 2.83 nm is obtained. Thus, in cases where fused quartz is used for the substrate, the amount of thermal deformation that occurs is much larger than the permissible error of 0.81 nm. Thus, a resolution at the diffraction limit cannot be obtained in an X-ray optical system constructed from mirrors using fused quartz as a substrate material.

Accordingly, it is desirable to use metal substrates of the above-mentioned types as the substrate in the mirror of the present invention. In particular, it is desirable to use an Invar alloy, which has a low thermal expansion rate.

Invar alloys (hereinafter "Invar") are known as materials which show a conspicuously small coefficient of thermal expansion as a result of the effects of magnetostriction. Invar include Fe—Ni alloys, Fe—Ni—Co alloys, Fe—Co—Cr alloys, Fe—Pt alloys, Fe—Pd alloys, Zr—Nb—Fe alloys, Cr—Fe—Sn alloys, Mn—Ge—Fe alloys, Fe—B amorphous alloys and Fe—Ni—Zr amorphous alloys, etc. The thermal conductivity of Invar is 12.9 [W/m·K], and the coefficient of thermal expansion is $0.01 \times 10^{-6}$. If the amount of thermal deformation of Invar is calculated from this numerical value using Equation (1), a value of 0.097 nm is obtained; thus, thermal deformation can be suppressed to a sufficiently small value compared to the above-mentioned permissible shape error.

Generally, however, fine crystal grain boundaries are present in metals; accordingly, it is difficult to polish such metals to surfaces that are smooth on the order of nanometers. In *Optical Systems for X-Rays* by Alan G. Michette (1986, Plenum Press, New York), page 74, there is a description of surface roughness values that can be obtained by polishing substances that are candidates for use as X-ray mirror materials. According to this description, the rms (root mean square) value of the minimum surface roughness obtained using various materials is the smallest, namely 0.4 nm, in the case of fused quartz and SiC manufactured by CVD (chemical vapor deposition). Since these materials are amorphous substances that do not have fine structures, a smooth surface can be obtained.

In the case of metals, however, aluminum can only be worked to a surface roughness of approximately 1.0 nm (rms), and copper can only be worked to a surface roughness of approximately 1.3 nm (rms). In the case of gold, silver and beryllium as well, it is impossible to work these metals to a smaller surface roughness value. In the case of Invar, which consists of a metal, the material can only be worked to a surface roughness of approximately 2.8 nm (rms). In the case of other metals as well, only working to a comparable surface roughness is possible.

The surface roughness required in the substrate of a multi-layer mirror for X-ray use can be calculated or estimated from the following equation:

$$R/R_0 = \exp\{-4\pi(\sigma \sin \theta/\lambda)^2\} \quad (6)$$

Here, $R_0$: reflectivity where there is no surface roughness

Figure 4:
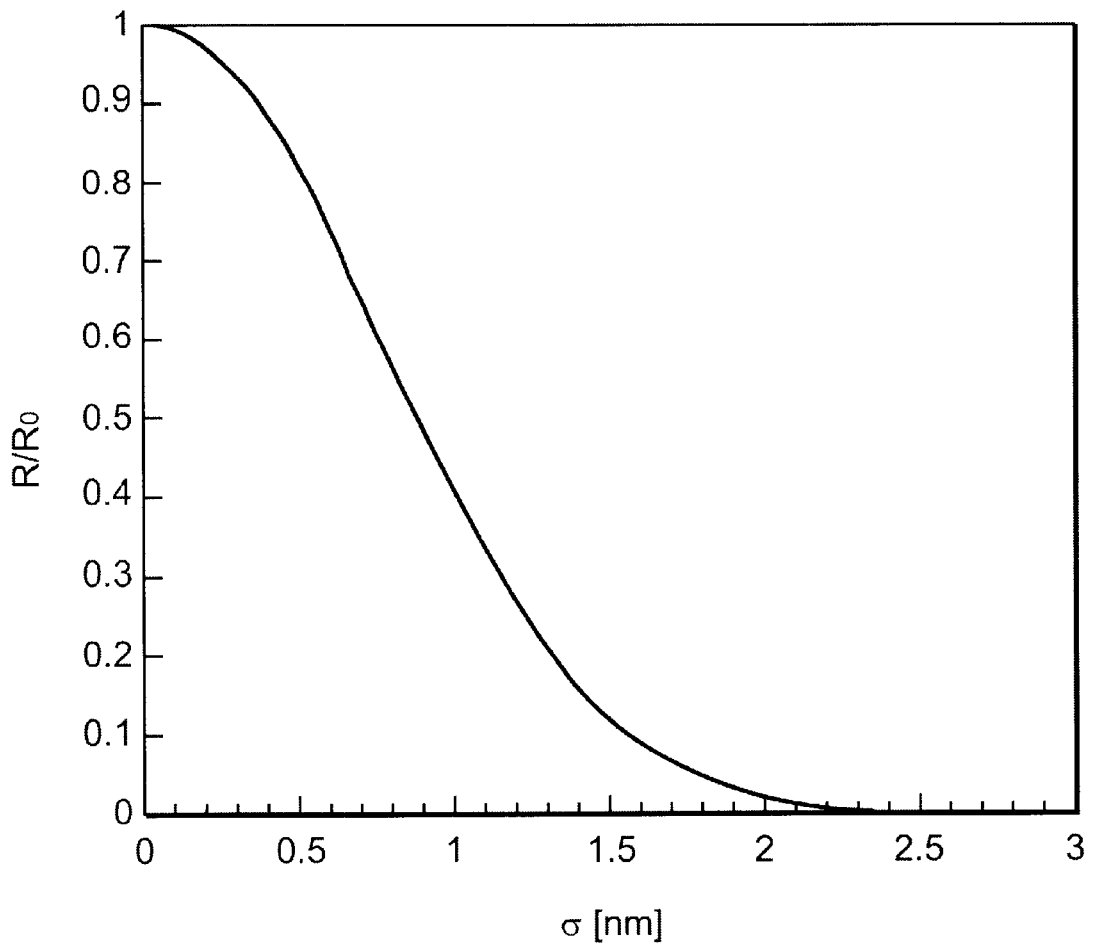
FIG. 4 is a graph that shows the difference in the reflectivity of a multi-layer film mirror according to the surface roughness of the substrate that constitutes the reflective mirror.

R: reflectivity where there is scattering loss due to surface roughness $\sigma$: rms value of surface roughness $\lambda$: wavelength of X-rays $\theta$: angle of oblique incidence FIG. 4 shows the values of $R/R_0$ for a surface roughness of $\sigma$ where $\lambda=13$ nm, and $\theta=90°$ (perpendicular incidence). As is clear from FIG. 4 a reflectivity that is close to 90% of the reflectivity obtained in an ideal case with no roughness can be obtained if SiC or fused quartz with a surface roughness of 0.4 nm (rms) is used as the substrate of the multi-layer film mirror. However, when Invar having a surface roughness of approximately 2.8 nm is used, X-rays are not reflected at all. Further, when a metal having a surface roughness of approximately 1 nm or greater is used in such a substrate, the X-ray reflectivity drops to half or less.

The present inventors, as a result of diligent research, discovered that a mirror substrate in which both thermal deformation and surface roughness are sufficiently small can be manufactured if a layer of an amorphous substance whose surface roughness can be reduced is formed on the surface of a metal such as Invar, or other metal with a high thermal conductivity (e. g., aluminum, copper, beryllium, silver, gold or alloys containing these metals) that shows little thermal deformation.

Specifically, with reference to FIG. 2, a mirror in which both thermal deformation and surface roughness are sufficiently small can be manufactured by (1) forming a thin film layer of an amorphous substance (e. g., an amorphous thin film layer consisting of a nickel alloy or an amorphous thin film layer whose chief component is a nickel alloy) on the surface of a metal such as Invar, aluminum, copper, beryllium, silver gold or an alloy containing such metals; (2) working (e. g., cutting, grinding and polishing) this surface to form an optically flat surface; and (3) then forming an X-ray-reflective multi-layer film on the surface of this worked thin film layer consisting of an amorphous substance, so that a multi-layer mirror is produced.

Such a metal mirror shows little thermal deformation, and is superior in terms of heat dissipation characteristics. Accordingly, a projection optical system constructed using such metal mirrors shows no deterioration in optical characteristics even when irradiated with strong soft X-rays. Thus, a soft X-ray projection exposure apparatus which has a projection system using such metal mirrors makes it possible to realize a high through-put than is possible in conventional systems.

Furthermore, with continuing reference to FIG. 4, the drop in reflectivity can be kept to 20% or less if the surface roughness (rms) of the thin film layer of the above-mentioned amorphous substance is reduced to 0.5 nm or less. Accordingly, such a small surface roughness is desirable. If the surface roughness exceeds this limit, the reflectivity drops abruptly.

In the above-mentioned work of Michette, the surface roughness of nickel formed by electroless plating is considered to be 1.1 nm. However, as a result of recent progress in working techniques, such as cutting, grinding and polishing, working to a smaller surface roughness comparable to that of fused quartz has become possible. Accordingly, in the present working configuration, an amorphous thin film layer consisting of a nickel alloy, or an amorphous thin film layer whose chief ingredient is a nickel alloy, is used as the above-mentioned thin film layer of an amorphous substance. As was mentioned above, the surface roughness of such an amorphous thin film layer can be reduced to 0.4 nm (rms). As is seen from FIG. 4, the drop in reflectivity of the multi-layer film mirror due to surface roughness can be kept to 10% or less, so that a sufficiently high reflectivity can be obtained.

Silicon oxide ($SiO_2$) or silicon carbide (SiC), can be used as the above-mentioned thin film layer consisting of an amorphous substance. According to the above-mentioned work of Michette, the surface roughness of $SiO_2$ and SiC can be reduced to 0.4 nm (rms). Accordingly, as is seen from FIG. 4, the drop in reflectivity of the multi-layer film mirror can be kept to 10% or less, so that a mirror with a sufficiently high reflectivity can be obtained.

Amorphous thin films of $SiO_2$ or SiC can be formed by ordinary thin-film formation techniques such as vacuum evaporation, sputtering, ion plating or CVD (chemical vapor deposition). When a thin film is formed on a metal substrate consisting of Invar, if the substrate temperature during film formation is too high, there will be an increase in surface roughness caused by oxidation and crystallization of the surface of the metal substrate. Accordingly, such an excessively high temperature is undesirable. In the case of vacuum evaporation, sputtering and ion plating, film formation is possible at room temperature. Furthermore, when CVD is used, it is desirable to use plasma CVD and light CVD that allow film formation at low temperatures ranging from room temperature to approximately 300° C., rather than hot CVD in which films are formed at high temperatures exceeding 1000° C.

Furthermore, there are no particular restrictions on the material of the amorphous thin film formed on the surface of the metal substrate, as long as the material used is a material whose surface can be polished to a smooth surface. Since the thickness of this thin film is small, i.e., a few microns, the selection of material is not restricted by thermal conductivity or coefficient of thermal expansion. For example, in addition to the above-mentioned nickel alloys, silicon oxide ($SiO_2$) and silicon carbide (SiC), it is also possible to use PSG (phospho-silicate glass), silicon nitride ($Si_3N_4$), silicon (Si) or carbon (C).

Furthermore, as is clear from Equation (1), the amount of thermal deformation $\Delta x$ is proportional to $\alpha$ (coefficient of thermal expansion)/$\eta$ (thermal conductivity). Accordingly, besides using metals with a small coefficient of thermal expansion such as Invar, it is also effective to use metals that have a large thermal conductivity as described above.

In the case of fused quartz, $\alpha/\eta$ is $3.62 \times 10^{-7}$ [m/W].

The coefficient of thermal expansion of aluminum is $25 \times 10^{-6}$/K, and the thermal conductivity is 237 [W/m·K]; accordingly, $\alpha/\eta$ is $1.05 \times 10^{-7}$ [m/W].

The coefficient of thermal expansion of copper is $16.6 \times 10^{-6}$/K, and the thermal conductivity is 401 [W/m·K]; accordingly, $\alpha/\eta$ is $4.14 \times 10^{-8}$ [m/W].

The coefficient of thermal expansion of beryllium is $12 \times 10^{-6}$/K, and the thermal conductivity is 201 [W/m·K]; accordingly, $\alpha/\eta$ is $5.95 \times 10^{-8}$ [m/W].

The coefficient of thermal expansion of silver is $19 \times 10^{-6}$/K, and the thermal conductivity is 429 [W/m·K]; accordingly, $\alpha/\eta$ is $4.43 \times 10^{-8}$ [[m/W]].

The coefficient of thermal expansion of gold is $14.2 \times 10^{-6}$/K, and the thermal conductivity is 318 [W/m·K]; accordingly, $\alpha/\eta$ is $4.47 \times 10^{-8}$ [m/W].

Thus, if metals such as aluminum, copper, silver, beryllium or gold, etc., are used, the value of $\alpha$ (coefficient of thermal expansion)/$\eta$ (thermal conductivity) can be reduced to a value that is $1/3$ to $1/9$ the value obtained in the case of fused quartz. Accordingly, the amount of thermal deformation $\Delta x$ can also be reduced by a corresponding amount. With metals having a common coefficient of thermal expansion, the amount of deformation of the mirror can be suppressed to 1 nm or less by using a metal that has a thermal conductivity of 200 [W/m·K] or greater.

An eighth embodiment of the present invention is a reflective mirror that is used in places where large amounts of heat from incident light rays are absorbed. This mirror is characterized by the fact that the mirror has a metal substrate or alloy substrate, and a thin film of an amorphous substance that is formed on the surface of the above-mentioned substrate, and a surface that is polished to optical smoothness.

The present means is used in projection exposure apparatuses that use light rays other than X-rays. In order to allow efficient escape of the heat generated by the light incident on the reflective mirror to the side of the cooling device disposed on the undersurface of the reflective mirror, a metal substrate or alloy substrate is used as the substrate. Accordingly, shape error occurring as a result of thermal deformation is decreased. Furthermore, a metal substrate or alloy substrate can be easily worked. Thus, the shape error occurring during manufacture can be reduced.

However, it is difficult to reduce the surface roughness of a metal substrate or alloy substrate. Consequently, such substrates cannot be used "as is" in the reflective mirror that constitutes the object of the present invention. Accordingly, an amorphous substance whose surface is polished to an optical smoothness is formed on the surface of such substrates. The surface of such an amorphous substance can be polished smooth. Therefore, the object of the present invention can be achieved by using such a substance as the reflective surface.

Specifically, the present invention makes it possible to reduce shape error and surface roughness. Furthermore, thermal deformation caused by irradiating light can be suppressed to a sufficiently small value. Accordingly, illuminating light with a strong intensity can be used, so that both a high resolution and a high through-put can be simultaneously achieved in a projection exposure apparatus.

A ninth embodiment used in order to achieve the above-mentioned object is a reflective mirror that is used in places where large amounts of heat from incident light rays or X-rays are absorbed. This mirror is characterized by the fact that the mirror has a metal substrate or alloy substrate, a thin film of an amorphous substance that is formed on the surface of the above-mentioned substrate and whose surface is polished to optical smoothness, and a multi-layer film that is formed on the surface of the above-mentioned thin film and reflects X-rays of a specified wavelength.

The present embodiment of the invention is used in a projection exposure apparatus that uses X-rays, and differs from the above-mentioned eighth embodiment only in that a multi-layer film is formed in order to reflect X-rays. The effect is the same as that of the above-mentioned eighth embodiment. However, since the amount of input heat is especially large in cases when X-rays are used, the effect of the present embodiment is great.

A tenth embodiment consists of the above-mentioned eighth or ninth embodiments, and is characterized by the fact that the surface roughness of the above-mentioned amorphous substance is 0.5 nm (rms) or less.

As will be described below, setting the surface roughness of the above-mentioned amorphous substance at 0.5 nm (rms) or less makes it possible to obtain a reflectivity of 80% or more of the reflectivity of a perfectly flat surface with respect to practical X-rays. Furthermore, since the surface roughness of the amorphous substance is 0.5 nm (rms) or less, the irregularity of the multi-layer film formed on top of the amorphous substance has a similar value, so that an optically flat reflective body can be obtained.

An eleventh embodiment consists of any of the above-mentioned eighth through tenth embodiments, and is characterized by the fact that the above-mentioned amorphous substance or the chief component of the above-mentioned amorphous substance is nickel or a nickel alloy.

In the case of nickel alloys, a film can easily be formed on the surface of a metal substrate or alloy substrate by plating. Furthermore, the surface roughness can be controlled to approximately 0.4 nm (rms) by working. Accordingly, it is desirable to use such alloys as the above-mentioned amorphous substance.

A twelfth embodiment consists of any of the above-mentioned eighth through eleventh means, which is characterized by the fact that the Equation (1) is satisfied.

A thirteenth embodiment consists of any of the above-mentioned eighth through twelfth means, which is characterized by the fact that the thermal conductivity of the above-mentioned substrate is 200 [W/m·K] or greater.

When a metal or alloy, which has an ordinary coefficient of thermal expansion, is used as a substrate having a thermal conductivity of less than 200 [W/m·K], the deformation will be large when this substrate is used as a reflective mirror in a projection exposure apparatus using X-rays. Thus, a mirror with sufficient precision cannot be obtained.

A fourteenth embodiment consists of any of the above-mentioned eighth through thirteenth embodiments, and is characterized by the fact that the material of the above-mentioned substrate is a material selected from a set consisting of aluminum, alloys containing aluminum, copper, alloys containing copper, beryllium, alloys containing beryllium, silver, alloys containing silver, gold, and alloys containing gold.

These materials have a high thermal conductivity. Accordingly, when such materials are used as the material of the above-mentioned substrate, the amount of thermal deformation caused by incident X-rays is small. A mirror that is favorable for use as a reflective mirror in a projection exposure apparatus can be obtained.

A fifteenth embodiment is a method for manufacturing a reflective mirror that includes a process in which a metal substrate or alloy substrate is prepared, a process in which an amorphous thin film consisting of a nickel alloy or an amorphous thin film whose chief ingredient is a nickel alloy is formed on the surface of the above-mentioned substrate, and a process in which the surface of the above-mentioned amorphous thin film is worked into an optically smooth surface.

This embodiment makes it possible to form an amorphous thin film consisting of a nickel alloy (or an amorphous thin film whose chief ingredient is a nickel alloy) that has an extremely small surface roughness on the surface of the above-mentioned metal substrate or alloy substrate that shows a small thermal deformation. Accordingly, a reflective mirror that is suitable for use in a projection exposure apparatus utilizing light rays other than X-rays can be obtained.

A sixteenth embodiment is a method for manufacturing a reflective mirror that includes a process in which a metal substrate or alloy substrate is prepared, a process in which an amorphous thin film consisting of a nickel alloy or an amorphous thin film whose chief ingredient is a nickel alloy is formed on the surface of the above-mentioned substrate, a process in which the surface of the above-mentioned amorphous thin film is worked into an optically smooth surface, and a process in which a multi-layer film that reflects X-rays of a specified wavelength is formed on the surface of the above-mentioned amorphous thin film that has been worked into an optically smooth surface.

In this embodiment, a process in which a multi-layer film that reflects X-rays of a specified wavelength is formed is added to the above-mentioned fifteenth embodiment. This embodiment makes it possible to form an amorphous thin film consisting of a nickel alloy (or an amorphous thin film whose chief ingredient is a nickel alloy) which has an extremely small surface roughness on the surface of the above-mentioned metal substrate or alloy substrate which shows a small thermal deformation. Accordingly, the irregularity in the multi-layer film that reflects X-rays is also small, so that a reflective mirror which is suitable for use in a projection exposure apparatus utilizing X-rays can be obtained.

A seventeenth embodiment consists of the above-mentioned fifteenth means or sixteenth embodiment, and is characterized by the fact that the above-mentioned amorphous thin film consisting of a nickel alloy or amorphous thin film whose chief ingredient is a nickel alloy is formed by a plating process.

If a plating process, especially an electroless plating process, is used, the above-mentioned amorphous thin film consisting of a nickel alloy or amorphous thin film whose chief ingredient is a nickel alloy can easily be formed.

The thermal deformation $\Delta x$ of a substrate in which a nickel thin film is formed on the surface of aluminum will be investigated using Equation (1). The thermal flux Q injected into the substrate is assumed to be 10 $[mW/cm^2]$, and the overall thickness of the substrate is set at 12.5 mm. In this case, the amount of deformation of the aluminum substrate alone is 0.83 nm. Even if a nickel thin film layer with a thickness of 1 mm is formed on the surface of this substrate, the thermal deformation of the nickel thin film layer is 0.007 nm, so that the thermal deformation $\Delta x$ hardly differs from that of aluminum alone. Accordingly, the thermal deformation can be suppressed to a value which is sufficiently smaller than the permitted shape error.

The thermal deformation $\Delta x$ of a substrate in which a nickel thin film is formed on the surface of copper will be investigated using Equation (1). The thermal flux Q injected into the substrate is assumed to be 10 $[mW/cm^2]$, and the overall thickness of the substrate is set at 12.5 mm. In this case, the amount of deformation of the copper substrate alone is 0.32 nm. Even if a nickel thin film layer with a thickness of 1 mm is formed on the surface of this substrate, the thermal deformation of the nickel thin film layer is 0.007 nm, so that the thermal deformation $\Delta x$ hardly differs from that of copper alone. Accordingly, the thermal deformation can be suppressed to a value which is sufficiently smaller than the permitted shape error.

The thermal deformation $\Delta x$ of a substrate in which a nickel thin film is formed on the surface of beryllium will be investigated using Equation (1). The thermal flux Q injected into the substrate is assumed to be 10 $[mW/cm^2]$, and the overall thickness of the substrate is set at 12.5 mm. In this case, the amount of deformation of the beryllium substrate alone is 0.47 nm. Even if a nickel thin film layer with a thickness of 1 mm is formed on the surface of this substrate, the thermal deformation of the nickel thin film layer is 0.007 nm, so that the thermal deformation $\Delta x$ hardly differs from that of beryllium alone. Accordingly, the thermal deformation can be suppressed to a value which is sufficiently smaller than the permitted shape error.

The thermal deformation $\Delta x$ of a substrate in which a nickel thin film is formed on the surface of silver will be investigated using Equation (1). The thermal flux Q injected into the substrate is assumed to be 10 $[mW/cm^2]$, and the overall thickness of the substrate is set at 12.5 mm. In this case, the amount of deformation of the silver substrate alone is 0.35 nm. Even if a nickel thin film layer with a thickness of 1 mm is formed on the surface of this substrate, the thermal deformation of the nickel thin film layer is 0.007 nm, so that the thermal deformation $\Delta x$ hardly differs from that of silver alone. Accordingly, the thermal deformation can be suppressed to a value which is sufficiently smaller than the permitted shape error.

The thermal deformation $\Delta x$ of a substrate in which a nickel thin film is formed on the surface of gold will be investigated using Equation (1). The thermal flux Q injected into the substrate is assumed to be 10 $[mW/cm^2]$, and the overall thickness of the substrate is set at 12.5 mm. In this case, the amount of deformation of the gold substrate alone is 0.35 nm. Even if a nickel thin film layer with a thickness of 1 mm is formed on the surface of this substrate, the thermal deformation of the nickel thin film layer is 0.007 nm, so that the thermal deformation $\Delta x$ hardly differs from that of gold alone. Accordingly, the thermal deformation can be suppressed to a value which is sufficiently smaller than the permitted shape error.

When the surface of the amorphous thin film formed on the surface of the substrate is polished to the required surface roughness by means of working (e. g., cutting, grinding and polishing) techniques, the mirror substrate is completed. Furthermore, when used as an X-ray mirror, a multi-layer film for the reflection of X-rays may be formed on the surface of the amorphous thin film. Since this multi-layer film has a thickness of only a few tenths of a micron, the thermal deformation of this film can be ignored.

An amorphous thin film layer consisting of a nickel alloy, can be formed by plating, especially electroless plating.

Below, embodiments or working examples of the projection exposure apparatus and mirror of the present invention are described in greater detail.

WORKING EXAMPLE 1

An amorphous thin film consisting of an alloy of nickel and phosphorous (Ni (90 wt %)-P (10 wt %)) was formed by electroless plating on the surface of Invar, and the surface of this film was worked (cut, ground and polished) to the required surface roughness. Then, an X-ray-reflective multi-layer film was formed on the worked surface of the amorphous thin film, thus producing an X-ray multi-layer film mirror with a diameter of 50 mm, a curvature radius of 500 mm and a center thickness of 12.5 mm. The manufacturing process of this mirror will be described in order with reference to FIG. 2.

First, the Invar material was cut to produce an Invar substrate 21, which had a diameter of 50 mm and a center thickness of 12 mm. The front surface of the substrate was a concave surface with a curvature radius of 500 mm and the back surface was a flat surface.

Then, after the front surface of the substrate (i.e., the surface on which the thin film was to be formed) was finished by electrolytic polishing to a mirror surface with a surface roughness of 10 nm (rms) or less, an amorphous thin film 22 consisting of an alloy of nickel and phosphorous ((Ni (90 wt %)-P (10 wt %)) was formed to a thickness of 500 $\mu$m on this surface by an electroless plating process.

Next, the surface of the amorphous thin film 22 was cut and polished, and was thus smoothed until the surface roughness was 0.4 nm (rms).

Thus, an X-ray mirror substrate, in which an amorphous thin film 22 consisting of a nickel alloy was formed on an Invar substrate 21, was produced.

Finally, an X-ray-reflective multi-layer film 23 with 50 laminated layers and a periodic length of 6.7 nm consisting of molybdenum (Mo) and silicon (Si) was formed on the front surface of the substrate by ion beam sputtering, thus completing the X-ray multi-layer film mirror.

When the back surface of this multi-layer film mirror was cooled and maintained at a constant temperature, the thermal deformation was 0.1 nm or less even when a thermal flux of 10 [mW/cm$^2$] was incident on all or part of the surface. Accordingly, it was possible to construct a diffraction limit optical system using X-rays with a wavelength of 13 nm.

Accordingly, with reference to FIG. 1, this reflective mirror was used as the mirror 8, which had the largest thermal load among the mirrors in the projection system. Under conditions producing a through-put of 30 wafers/hour, the intensity of the X-rays incident on the mirror 8 was approximately 30 [mW/cm$^2$]. 30% of the X-rays incident on the mirror 8 (approximately 9 [mW/cm$^2$]) were absorbed and converted into a thermal load; however, the thermal deformation was less than 0.1 nm, so that the mirror was sufficiently usable as a mirror in a high-through-put soft X-ray projection exposure apparatus using X-rays with a wavelength of 13 nm.

WORKING EXAMPLE 2

An amorphous thin film consisting of silicon oxide (SiO$_2$) was formed by sputtering on the surface of Invar, and the surface of this film was worked (cut, ground and polished) to the required surface roughness. Then, an X-ray-reflective multi-layer film was formed on the worked surface of the amorphous thin film, thus producing an X-ray multi-layer film mirror with a diameter of 50 mm, a curvature radius of 500 mm and a center thickness of 12 mm. The manufacturing process of this mirror will be described in order with reference to FIG. 2.

First, the Invar material was cut to produce an Invar substrate 21, which had a diameter of 50 mm and a center thickness of 12 mm. The front surface of the substrate was a concave surface with a curvature radius of 500 mm and the back surface was a flat surface.

Then, after the front surface of the substrate (i.e., the surface on which the thin film was to be formed) was finished by electrolytic polishing to a mirror surface with a surface roughness of 10 nm (rms) or less, an amorphous thin film 22 consisting of SiO$_2$ was formed to a thickness of 5 $\mu$m on this surface by radio frequency magnetron sputtering.

Next, the surface of the amorphous thin film 22 was cut and polished, and was thus smoothed until the surface roughness was 0.4 nm (rms).

Thus, an X-ray mirror substrate, in which an amorphous thin film 22 consisting of SiO$_2$ was formed on an Invar substrate 21, was produced.

Finally, an X-ray-reflective multi-layer film 23 with 50 laminated layers and a periodic length of 6.7 nm consisting of molybdenum (Mo) and silicon (Si) was formed on the front surface of the substrate by ion beam sputtering, thus completing the X-ray multi-layer film mirror.

When the back surface of this multi-layer film mirror was cooled and maintained at a constant temperature, the thermal deformation was 0.1 nm or less even when a thermal flux of 10 [mW/cm$^2$] was incident on all or part of the surface. Accordingly, it was possible to construct a diffraction limit optical system using X-rays with a wavelength of 13 nm.

Accordingly, this reflective mirror was used as the mirror 8, which had the largest thermal load among the mirrors in the projection system of the soft X-ray projection exposure apparatus shown in FIG. 1. Under conditions producing a through-put of 30 wafers/hour, the intensity of the X-rays incident on the mirror 8 was approximately 30 [mW/cm$^2$]. 30% of the X-rays incident on the mirror 8 (approximately 9 [mW/cm$^2$]) were absorbed and converted into a thermal load; however, the thermal deformation was less than 0.1 nm, so that the mirror was sufficiently usable as a mirror in a high-through-put soft X-ray projection exposure apparatus using X-rays with a wavelength of 13 nm.

WORKING EXAMPLE 3

An amorphous thin film consisting of silicon carbide (SiC) was formed by CVD on the surface of Invar, and the surface of this film was worked (cut, ground and polished) to the required surface roughness. Then, an X-ray-reflective multi-layer film was formed on the worked surface of the amorphous thin film, thus producing an X-ray multi-layer film mirror with a diameter of 50 mm, a curvature radius of 500 mm and a center thickness of 12 mm. The manufacturing process of this mirror will be described in order with reference to FIG. 2.

First, an Invar material was cut to produce an Invar substrate 21, which had a diameter of 50 mm, a center thickness of 12 mm, a concave front surface with a curvature radius of 500 mm, and a flat back surface.

Then, the front surface of the substrate (i.e., the surface on which the thin film was to be formed) was finished by electrolytic polishing to a mirror surface with a surface roughness of 10 nm (rms) or less. Afterward, an amorphous thin film 22 consisting of SiC was formed on this surface to a thickness of 50 μm by means of plasma CVD using $SiCl_4$ and $CH_4$ as raw materials.

Next, the surface of the amorphous thin film 22 was cut and polished, and was thus smoothed until the surface roughness was 0.4 nm (rms).

Thus, an X-ray mirror substrate, in which an amorphous thin film 22 consisting of SiC was formed on an Invar substrate 21, was produced.

Finally, an X-ray-reflective multi-layer film 23 with 50 laminated layers and a periodic length of 6.7 nm consisting of molybdenum (Mo) and silicon (Si) was formed on the front surface of the substrate by high frequency magnetron sputtering, thus completing the X-ray multi-layer film mirror.

When the back surface of this multi-layer film mirror was cooled and maintained at a constant temperature, the thermal deformation was 0.1 nm or less even when a thermal flux of 10 [$mW/cm^2$] was incident on all or part of the surface. Accordingly, it is possible to construct a diffraction limit optical system using X-rays with a wavelength of 13 nm.

Accordingly, this reflective mirror was used as the mirror 8, which had the largest thermal load among the mirrors in the projection system of the soft X-ray projection exposure apparatus shown in FIG. 1. Under conditions producing a through-put of 30 wafers/hour, the intensity of the X-rays incident on the mirror 8 was approximately 30 [$mW/cm^2$]. 30% of the X-rays incident on the mirror 8 (approximately 9 [$mW/cm^2$]) were absorbed and converted into a thermal load; however, the thermal deformation was less than 0.1 nm, so that the mirror was sufficiently usable as a mirror in a high-through-put soft X-ray projection exposure apparatus using X-rays with a wavelength of 13 nm.

WORKING EXAMPLE 4

In the present working example, an amorphous thin film consisting of an alloy of nickel and phosphorous (Ni (90 wt %)-P (10 wt %)) was formed by electroless plating on the surface of aluminum, and this surface was worked (cut, ground and polished) to produce the necessary surface roughness. Furthermore, an X-ray-reflective multi-layer film was formed on the surface of the worked amorphous thin film, thus producing an X-ray multi-layer film reflective mirror which had a diameter of 50 mm, a curvature radius of 500 mm, and a center thickness of 12.5 mm. The manufacturing process of this mirror will be explained in order with reference to FIG. 2.

First, the aluminum material was cut to produce an aluminum substrate 21, which had a diameter of 50 mm and a center thickness of 12 mm. The front surface of the substrate was a concave surface with a curvature radius of 500 mm and the back surface was a flat surface.

Then, after the front surface of the substrate (i.e., the surface on which the thin film was to be formed) was finished by electrolytic polishing to a mirror surface with a surface roughness of 10 nm (rms) or less, an amorphous thin film 22 consisting of an alloy of nickel and phosphorous (Ni (90 wt %)-P (10 wt %)) was formed to a thickness of 500 μm on this surface by an electroless plating process.

Next, the surface of the amorphous thin film 22 was cut and polished, and was thus smoothed until the surface roughness was 0.4 nm (rms).

Thus, an X-ray mirror substrate, in which an amorphous thin film 22 consisting of a nickel alloy was formed on an aluminum substrate 21, was produced.

Finally, an X-ray-reflective multi-layer film 23 with 50 laminated layers and a periodic length of 6.7 nm consisting of molybdenum (Mo) and silicon (Si) was formed on the front surface of the substrate by ion beam sputtering, thus completing the X-ray multi-layer film mirror.

When the back surface of this multi-layer film mirror was cooled and maintained at a constant temperature, the thermal deformation was 0.1 nm or less even when a thermal flux of 10 [$mW/cm^2$] was incident on all or part of the surface. Accordingly, it was possible to construct a diffraction limit optical system using X-rays with a wavelength of 13 nm.

Similar results were obtained when an alloy material containing aluminum was used instead of aluminum as the material of the metal substrate 21 with a high thermal conductivity.

WORKING EXAMPLE 5

In the present working example, an amorphous thin film consisting of a nickel alloy was formed by electroless plating on the surface of copper, and this surface was worked (cut, ground and polished) to produce the necessary surface roughness. Furthermore, an X-ray-reflective multi-layer film was formed on the surface of the worked amorphous thin film, thus producing an X-ray multi-layer film reflective mirror which had a diameter of 50 mm, a curvature radius of 500 mm, and a center thickness of 12.5 mm. The manufacturing process of this mirror will be explained in order with reference to FIG. 2.

First, the copper material was cut to produce a copper substrate 21, which had a diameter of 50 mm and a center thickness of 12 mm. The front surface of the substrate was a concave surface with a curvature radius of 500 mm and the back surface was a flat surface.

Then, after the front surface of the substrate (i.e., the surface on which the thin film was to be formed) was finished by electrolytic polishing to a mirror surface with a surface roughness of 10 nm (rms) or less, an amorphous thin film 22 consisting of an alloy of nickel and phosphorous (Ni (90 wt %)-P (10 wt %)) was formed to a thickness of 500 μm on this surface by an electroless plating process.

Next, the surface of the amorphous thin film 22 was cut and polished, and was thus smoothed until the surface roughness was 0.4 nm (rms).

Thus, an X-ray mirror substrate, in which an amorphous thin film 22 consisting of a nickel alloy was formed on a copper substrate 21, was produced.

Finally, an X-ray-reflective multi-layer film 23 with 50 laminated layers and a periodic length of 6.7 nm consisting of molybdenum (Mo) and silicon (Si) was formed on the front surface of the substrate by magnetron sputtering, thus completing the X-ray multi-layer film mirror.

When the back surface of this multi-layer film mirror was cooled and maintained at a constant temperature, the thermal deformation was 0.1 nm or less even when a thermal flux of 10 [$mW/cm^2$] was incident on all or part of the surface. Accordingly, it was possible to construct a diffraction limit optical system using X-rays with a wavelength of 13 nm.

Similar results were obtained when an alloy material containing copper was used instead of copper as the material of the metal substrate 21 with a high thermal conductivity.

WORKING EXAMPLE 6

In the present working example, an amorphous thin film consisting of a nickel alloy was formed by electroless plating on the surface of beryllium, and this surface was worked (cut, ground and polished) to produce the necessary surface roughness. Furthermore, an X-ray-reflective multilayer film was formed on the surface of the worked amorphous thin film, thus producing an X-ray multi-layer film reflective mirror which had a diameter of 50 mm, a curvature radius of 500 mm, and a center thickness of 12.5 mm. The manufacturing process of this mirror will be explained in order with reference to FIG. 2.

First, the beryllium material was cut to produce a beryllium substrate 21, which had a diameter of 50 mm and a center thickness of 12 mm. The front surface of the substrate was a concave surface with a curvature radius of 500 mm and the back surface was a flat surface.

Then, after the front surface of the substrate (i.e., the surface on which the thin film was to be formed) was finished by electrolytic polishing to a mirror surface with a surface roughness of 10 nm (rms) or less, an amorphous thin film 22 consisting of an alloy of nickel and phosphorous (Ni (90 wt %)-P (10 wt %)) was formed to a thickness of 500 $\mu$m on this surface by an electroless plating process.

Next, the surface of the amorphous thin film 22 was cut and polished, and was thus smoothed until the surface roughness was 0.4 nm (rms).

Thus, an X-ray mirror substrate, in which an amorphous thin film 22 consisting of a nickel alloy was formed on a beryllium substrate 21, was produced.

Finally, an X-ray-reflective multi-layer film 23 with 50 laminated layers and a periodic length of 6.7 nm consisting of molybdenum (Mo) and silicon (Si) was formed on the front surface of the substrate by ion beam sputtering, thus completing the X-ray multi-layer film mirror.

When the back surface of this multi-layer film mirror was cooled and maintained at a constant temperature, the thermal deformation was 0.1 nm or less even when a thermal flux of 10 [mW/cm$^2$] was incident on all or part of the surface. Accordingly, it was possible to construct a diffraction limit optical system using X-rays with a wavelength of 13 nm.

Similar results were obtained when an alloy material containing beryllium was used instead of beryllium as the material of the metal substrate 1 with a high thermal conductivity.

WORKING EXAMPLE 7

In the present working example, an amorphous thin film consisting of a nickel alloy was formed by electroless plating on the surface of silver, and this surface was worked (cut, ground and polished) to produce the necessary surface roughness. Furthermore, an X-ray-reflective multi-layer film was formed on the surface of the worked amorphous thin film, thus producing an X-ray multi-layer film reflective mirror which had a diameter of 50 mm, a curvature radius of 500 mm, and a center thickness of 12.5 mm. The manufacturing process of this mirror will be explained in order with reference to FIG. 2.

First, the silver material was cut to produce a silver substrate 21, which had a diameter of 50 mm and a center thickness of 12 mm. The front surface of the substrate was a concave surface with a curvature radius of 500 mm and the back surface was a flat surface.

Then, after the front surface of the substrate (i.e., the surface on which the thin film was to be formed) was finished by electrolytic polishing to a mirror surface with a surface roughness of 10 nm (rms) or less, an amorphous thin film 22 consisting of an alloy of nickel and phosphorous (Ni (90 wt %)-P (10 wt %)) was formed to a thickness of 500 $\mu$m on this surface by an electroless plating process.

Next, the surface of the amorphous thin film 22 was cut and polished, and was thus smoothed until the surface roughness was 0.4 nm (rms).

Thus, an X-ray mirror substrate, in which an amorphous thin film 22 consisting of a nickel alloy was formed on a silver substrate 21, was produced.

Finally, an X-ray-reflective multi-layer film 23 with 50 laminated layers and a periodic length of 6.7 nm consisting of molybdenum (Mo) and silicon carbide (SiC) was formed on the front surface of the substrate by magnetron sputtering, thus completing the X-ray multi-layer film mirror.

When the back surface of this multi-layer film mirror was cooled and maintained at a constant temperature, the thermal deformation was 0.1 nm or less even when a thermal flux of 10 [mW/cm$^2$] was incident on all or part of the surface. Accordingly, it was possible to construct a diffraction limit optical system using X-rays with a wavelength of 13 nm.

Similar results were obtained when an alloy material containing silver was used instead of silver as the material of the metal substrate 21 with a high thermal conductivity.

WORKING EXAMPLE 8

In the present working example, an amorphous thin film consisting of a nickel alloy was formed by electroless plating on the surface of gold, and this surface was worked (cut, ground and polished) to produce the necessary surface roughness. Furthermore, an X-ray-reflective multi-layer film was formed on the surface of the worked amorphous thin film, thus producing an X-ray multi-layer film reflective mirror which had a diameter of 50 mm, a curvature radius of 500 mm, and a center thickness of 12.5 mm. The manufacturing process of this mirror will be explained in order with reference to FIG. 2.

First, the gold material was cut to produce a gold substrate 1, which had a diameter of 50 mm and a center thickness of 12 mm. The front surface of the substrate was a concave surface with a curvature radius of 500 mm and the back surface was a flat surface.

Then, after the front surface of the substrate (i.e., the surface on which the thin film was to be formed) was finished by electrolytic polishing to a mirror surface with a surface roughness of 10 nm (rms) or less, an amorphous thin film 22 consisting of an alloy of nickel and phosphorous (Ni (90 wt %)-P (10 wt %)) was formed to a thickness of 500 $\mu$m on this surface by an electroless plating process.

Next, the surface of the amorphous thin film 22 was cut and polished, and was thus smoothed until the surface roughness was 0.4 nm (rms).

Thus, an X-ray mirror substrate, in which an amorphous thin film 22 consisting of a nickel alloy was formed on a gold substrate 21, was produced.

Finally, an X-ray-reflective multi-layer film 23 with 50 laminated layers and a periodic length of 6.7 nm consisting of molybdenum (Mo) and silicon carbide (SiC) was formed on the front surface of the substrate by ion beam sputtering, thus completing the X-ray multi-layer film mirror.

When the back surface of this multi-layer film mirror was cooled and maintained at a constant temperature, the thermal deformation was 0.1 nm or less even when a thermal flux of 10 [mW/cm$^2$] was incident on all or part of the surface. Accordingly, it was possible to construct a diffraction limit optical system using X-rays with a wavelength of 13 nm.

Similar results were obtained when an alloy material containing gold was used instead of gold as the material of the metal substrate 21 with a high thermal conductivity.

Furthermore, in the above-mentioned working examples, aluminum, copper, beryllium, silver and gold were respectively used as the material of the high-thermal-conductivity metal substrate 1. The material of the metal substrate 21 is not limited to these metals. It is desirable, though, that the thermal conductivity of the material used be 200 [W/m·K] or greater.

Using the reflective mirrors of the above-mentioned working examples, it was possible to reduce the shape error and surface roughness, and to suppress the thermal deformation caused by the illuminating light such as X-rays to a sufficiently small value. Furthermore, when the reflective mirrors of the above-mentioned working examples were used in an X-ray optical system, it was possible to achieve both a high resolution and a high through-put in an X-ray projection exposure apparatus.

The reflective mirrors of the above-mentioned working examples can be used in X-ray optical systems other than systems used in X-ray projection exposure apparatuses, and can also be used in high-precision reflective optical systems used in wavelength regions other than the X-ray region, and a similar effect can be obtained in such cases. Furthermore, when these mirrors are used in high-precision reflective optical systems used in wavelength regions other than the X-ray region, the above-mentioned multi-layer film 23 that reflects X-rays is unnecessary.

WORKING EXAMPLE 9

In the present working example, the X-ray multi-layer film reflective mirror manufactured in Working Example 4 was applied to the projection optical system of a soft X-ray projection exposure apparatus. This application to a soft X-ray projection exposure apparatus will be described with reference to FIG. 1. In FIG. 1, 1 indicates an X-ray source, 2 and 3 indicate X-ray multi-layer film mirrors (illumination system), 4 indicates a mask stage, 5 indicates a reflective mask, 6, 7, 8, and 9 indicate X-ray multi-layer film mirrors (projection system), 10 indicates a wafer stage, and 11 indicates a wafer.

A laser plasma light source was used as the X-ray source 1. In this apparatus, the beam radiated from the X-ray source 1 is focused by an illumination optical system consisting of two X-ray multi-layer film mirrors 2 and 3, so that the reflective mask 5 carried on the mask stage 4 is illuminated. The beam reflected by the reflective mask 5 passes through a projection optical system constructed from four X-ray multi-layer film mirrors 6, 7, 8, and 9, and reaches the wafer 11 held on the wafer stage 10. An image of the circuit pattern formed on the reflective mask 5 is transferred onto the wafer 11 after being reduced to ¼ the original size.

A molybdenum (Mo)/silicon (Si) multi-layer film that reflected soft X-rays with a wavelength in the vicinity of 13 nm was used for the X-ray multi-layer film mirrors 2, 3, 6, 7, 8 and 9 making up the illumination system and projection system, and for the reflective mask 5.

The reflectivity of the X-ray multi-layer film mirrors was approximately 70%, with the remaining 30% of the X-rays being absorbed by the mirrors and converted into heat. In this case, the intensity of the X-rays drops by an amount corresponding to the loss caused by absorption each time the X-rays are reflected from an X-ray multi-layer film mirror. Accordingly, the intensity of the X-rays incident on the respective X-ray multi-layer film mirrors is larger as the mirror in question is located upstream closer to the X-ray source 1. The respective mirrors were cooled by means of water cooling in order to dissipate the absorbed heat.

The reflective surfaces of the four mirrors 6, 7, 8 and 9 making up the projection optical system all had a shape that was rotationally symmetrical about the optical axis a—a. The mirror 8 was disposed on the optical axis a—a, and the effective diameter of the mirror 8 was the diaphragm of the projection optical system. Here, since the mirror 8 is located on the downstream side in the projection system (i.e., the third of four mirrors), the intensity of the X-rays incident on this mirror is not very strong; however, since the area irradiated by the X-rays is small, the irradiating X-ray intensity per unit area is the largest among the four mirrors making up the projection system.

Accordingly, an X-ray multi-layer film reflective mirror produced by forming an amorphous thin film consisting of an alloy of nickel and phosphorous (Ni (90 wt %)-P (10 wt %)) on the surface of the aluminum substrate manufactured in Working Example 4, and then forming a molybdenum (Mo)/silicon (Si) multi-layer film on the surface of this amorphous thin film, was used for the mirror 8, which had the largest thermal load among the mirrors in the projection system. Under conditions producing a through-put of 30 wafers/hour, the intensity of the X-rays incident on the mirror 8 was approximately 30 [mW/cm$^2$]. 30% of the X-rays incident on the mirror 8 (approximately 9 [mW/cm$^2$]) were absorbed and converted into a thermal load; however, the thermal deformation was less than 0.8 nm, so that a diffraction-limit optical system using X-rays with a wavelength of 13 nm was successfully constructed.

WORKING EXAMPLE 10

In the present working example, the X-ray multi-layer film reflective mirror manufactured in working example 5 was applied to the illumination optical system of a soft X-ray projection exposure apparatus. The present working example will be described with reference to FIG. 1.

As was described above, the reflectivity of an X-ray multi-layer film mirror is approximately 70%, with the remaining 30% of the X-rays being absorbed by the mirror and converted into heat. The intensity of the X-rays drops by an amount corresponding to the loss caused by absorption each time the X-rays are reflected from an X-ray multi-layer film mirror. Accordingly, the intensity of the X-rays incident on the respective X-ray multi-layer film mirrors is larger as the mirror in question is located upstream closer to the X-ray source 1. In particular, the intensity of the X-rays incident on the X-ray multi-layer film mirrors 2 and 3 of the illumination system located immediately after the X-ray source 1 is especially large; this creates a thermal load which causes deformation of the mirrors and deterioration of the multi-layer films.

Accordingly, X-ray multi-layer film reflective mirrors produced by forming an amorphous thin film consisting of an alloy of nickel and phosphorous (Ni (90 wt %)-P (10 wt %)) on the surface of the copper substrate manufactured in working example 5, and then forming a molybdenum (Mo)/silicon (Si) multi-layer film on the surface of this amorphous thin film, were used as the mirrors 2 and 3 making up the illumination system. Under conditions producing a through-put of 30 wafers/hour, the intensity of the X-rays incident on the mirrors 2 and 3 was approximately 100 [mW/cm$^2$]. 30% of the X-rays incident on the mirrors 2 and 3 (approximately 30 [mW/cm$^2$] were absorbed and converted into a thermal load; however, the thermal deformation was less than 1 nm, so that an optical system which was more or less close to the diffraction limit, and which used X-rays with a wavelength of 13 nm, was successfully constructed. Furthermore, no deterioration (change over time) of the multi-layer film caused by the thermal load was seen.

In the soft X-ray projection exposure apparatus and reflective mirror of the present invention, as was described above, the shape error and surface roughness of the mirror can be reduced, and the thermal deformation caused by irradiating light such as X-rays can be suppressed to a sufficiently small value. Accordingly, a high-precision optical system can be obtained. Further, there is no deterioration in focusing characteristics due to thermal deformation, even if the mirrors are irradiated by strong soft X-rays in order to increase the through-put. Consequently, the soft X-ray projection exposure apparatus and reflective mirror of the present invention make it possible to obtain both a high resolution and a high through-put in an X-ray projection exposure apparatus in which this mirror is used in the X-ray optical system.

Furthermore, the reflective mirror of the present invention can also be used in X-ray optical systems other than the optical systems of X-ray projection exposure apparatuses, or in high-precision reflective optical systems used in wavelength regions other than the X-ray region, and a similar effect can be obtained in such cases.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A soft X-ray projection exposure apparatus having at least one metal mirror constituting at least one of an illumination optical system and a projection optical system, the at least one mirror comprising:

a metal substrate having a front surface and a rear surface;

a thin film of an amorphous substance formed on the front surface of the metal substrate, a front surface of the amorphous substance being polished to optical smoothness; and a multi-layer film formed on the front surface of the thin film, wherein the multi-layer film reflects X-rays of a specified wavelength, and wherein at least a principal component of the amorphous substance is one of nickel or a nickel alloy.

2. The soft X-ray projection exposure apparatus according to claim 1, wherein the at least one mirror satisfies a condition of:

$$\alpha \cdot Q \cdot d^2 / (2\eta) \leq 10^{-9}$$

where $\eta$ is a thermal conductivity of the metal substrate, $\alpha$ is a coefficient of linear expansion, Q is a thermal flux applied to the metal mirror by electromagnetic radiation, and d is a mean thickness of the mirrors.

3. The soft X-ray projection exposure apparatus according to claim 1, wherein the metal substrate includes an Invar alloy.

4. The soft X-ray projection exposure apparatus according to claim 1, wherein the metal substrate includes at least one of aluminum, copper, beryllium, silver, gold, and an alloy containing at least one of aluminum, copper, beryllium, silver, gold.

5. The soft X-ray projection exposure apparatus according to claim 1, wherein a front surface roughness of the amorphous substance is at most 0.5 nm.

6. The soft X-ray projection exposure apparatus according to claim 1, wherein at least a principal component of the amorphous substance is selected from a set consisting of silicon oxide, silicon carbide, PSG (phospho-silicate glass), silicon nitride, silicon, and carbon.

7. The soft X-ray projection exposure apparatus according to claim 1, wherein the back surface of the metal substrate is cooled so that the back surface is maintained at a constant temperature.

8. A mirror, for use when large amounts of heat from incident electromagnetic radiation is absorbed, comprising:

a metal substrate having a front surface and a back surface;

a thin film of an amorphous substance formed on the front surface of the substrate, and having a surface polished to optical smoothness, wherein at least a chief component of the amorphous substance is one of nickel or a nickel alloy.

9. The mirror according to claim 8 further comprising:

a multi-layer film formed on a surface of the thin film, wherein the multi-layer reflects X-rays of a specified wavelength.

10. The mirror according to claim 8, wherein the surface roughness of the amorphous substance is at most 0.5 nm.

11. The mirror according to claim 8, wherein the mirror satisfies a condition of:

$$\alpha \cdot Q \cdot d^2 / (2\eta) \leq 10^{-9} [m]$$

where $\eta$ is a thermal conductivity of the substrate, $\alpha$ is a coefficient of linear expansion, Q is a thermal flux on the mirror from electromagnetic radiation, and d is a mean thickness of the mirror.

12. The mirror according to claim 8, wherein a thermal conductivity of the substrate is at least 200 [W/m·K].

13. The mirror according to claim 8, wherein a material of the metal substrate includes one of aluminum, an alloy containing aluminum, copper, an alloy containing copper, beryllium, an alloy containing beryllium, silver, an alloy containing silver, gold, and an alloy containing gold.

14. The mirror according to claim 8, wherein the back surface of the substrate is cooled so that the back surface is maintained at a constant temperature.

15. A method for manufacturing a mirror comprising:

preparing a metal substrate;

forming an amorphous thin film containing a nickel alloy as a chief ingredient on a surface of the metal substrate; and working a surface of the amorphous thin film into an optically smooth surface.

16. The method according to claim 15 further comprising:

forming a multi-layer film that reflects X-rays of a specified wavelength on the surface of the amorphous thin film that has been worked into an optically smooth surface.

17. The method according to claim 15 wherein the step of forming an amorphous thin film includes a plating process.

* * * * *